US012003092B2

(12) United States Patent
Cai et al.

(10) Patent No.: US 12,003,092 B2
(45) Date of Patent: Jun. 4, 2024

(54) CABLE WITH SIGNAL DETECTION FUNCTION

(71) Applicant: DongGuan City TuoCheng Industries Co., Ltd., Dongguan (CN)

(72) Inventors: Quanyu Cai, Dongguan (CN); Juntuo Yang, Dongguan (CN); Siwei Zhu, Dongguan (CN); Dong Wei, Dongguan (CN)

(73) Assignee: DongGuan City TuoCheng Industries Co., Ltd., Dongguan (CN)

( * ) Notice: Subject to any disclaimer, the term of this patent is extended or adjusted under 35 U.S.C. 154(b) by 0 days.

(21) Appl. No.: 17/889,593

(22) Filed: Aug. 17, 2022

(65) Prior Publication Data

US 2023/0016591 A1 Jan. 19, 2023

Related U.S. Application Data

(63) Continuation-in-part of application No. 17/839,582, filed on Jun. 14, 2022, and a continuation-in-part of
(Continued)

(30) Foreign Application Priority Data

Jul. 15, 2021 (CN) .......................... 202121615602.X
Apr. 21, 2022 (CN) .......................... 202220938204.X

(51) Int. Cl.
H01B 11/04    (2006.01)
G01R 31/52    (2020.01)
H01B 7/02     (2006.01)
H01B 7/32     (2006.01)
H02H 1/00     (2006.01)
(Continued)

(52) U.S. Cl.
CPC ............... *H02H 3/16* (2013.01); *G01R 31/52* (2020.01); *H01B 7/0216* (2013.01); *H01B 7/328* (2013.01); *H02H 1/0007* (2013.01); *H01R 13/5202* (2013.01); *H01R 13/7135* (2013.01)

(58) Field of Classification Search
CPC ................................ H01B 11/04; H01B 11/06
See application file for complete search history.

(56) References Cited

U.S. PATENT DOCUMENTS 6,010,788 A   1/2000 Kebabjian et al.
9,934,888 B2  4/2018 Yoshino et al.
(Continued)

FOREIGN PATENT DOCUMENTS

CN    105017676    * 11/2015
CN    109337231 A   2/2019

Primary Examiner — Chau N Nguyen

(57) ABSTRACT

A cable with a signal detection function includes an core, a second insulating layer, and a signal detection layer. The signal detection layer is for transmitting signal data. The cable further includes a second insulating layer, and plural signal detection layers provided for transmitting signal data. The signal detection layer and the cores are disposed inside the second insulating layer, and the signal detection layer is cladded with plural cores. If the first insulating layer in the signal detection layer is damaged, the signal detection layer will be electrically connected to the conductor assembly. The cable with the signal detection function can detect the abnormality of the core through the signal detection layer to facilitate maintaining and repair the cable.

11 Claims, 17 Drawing Sheets

Related U.S. Application Data application No. 17/394,895, filed on Aug. 5, 2021, now abandoned.

(51) Int. Cl.
*H02H 3/16* (2006.01)
*H01R 13/52* (2006.01)
*H01R 13/713* (2006.01)

(56) References Cited

U.S. PATENT DOCUMENTS

| | | |
|---|---|---|
| 10,333,263 B2 | 6/2019 | Wu et al. |
| 2008/0251274 A1 | 10/2008 | Lee et al. |
| 2019/0165567 A1* | 5/2019 | Aromin .............. H01R 13/6683 |

* cited by examiner

CABLE WITH SIGNAL DETECTION FUNCTION

FIELD OF THE INVENTION

The present invention relates to connection lines, and more particularly to a cable with a signal detection function and a leakage detection circuit breaker.

BACKGROUND OF THE INVENTION

Cable is an indispensable signal transmission device in daily life. It is necessary to use the cable in various electronic products such as power grids as a connector for signal transmission or power supply. Although the present existing cables are relatively durable and less affected by external factors, the cables may still be damaged during use. If the damaged cable cannot be detected timely, then it will paralyze the grids, affect people's safety, or cause damages to electronic products. At present, there are some cable structures on the market that can detect whether the interior of the cable is damaged, but these structures require the installation of a sensor or an inductive transmission device such as a Bluetooth device which is not practical since the interior space of the cable is limited and too many installed devices will affect the design of the cable and increase the cost of the cable, and thus these cable structures are not suitable for a large-scale use.

SUMMARY OF THE INVENTION

In view of the drawbacks of the conventional cables, the present invention provides a cable with a signal detection function which can detect the abnormality of a conductor assembly through a signal detection layer in order to facilitate the maintenance of the cable timely.

To overcome the drawbacks of the prior art, the present invention discloses a technical solution and provide a cable with a signal detection function, comprising a plurality of cores, each having a conductor assembly and a first insulating layer covering the outer periphery of the conductor assembly, characterized in that the cable further comprises a second insulating layer and a plurality of signal detection layers, and the signal detection layer being provided for transmitting signal data, and the signal detection layer and the plurality of cores are disposed in the second insulating layer; and the signal detection layer is cladded with the plurality of cores, and if the first insulating layer in the signal detection layer is damaged, the signal detection layer will be electrically coupled to the conductor assembly.

Preferably, the signal detection layer is cladded with at least two of the cores, and the first insulating layer disposed inside the signal detection layer abuts against the inner wall of the signal detection layer.

Preferably, the signal detection layer is a synthetic graphene layer.

Preferably, the first insulating layer disposed outside the signal detection layer abuts against the outer periphery of the signal detection layer.

Preferably, the outer periphery of the core disposed outside the signal detection layer is cladded with a signal mask layer.

Preferably, the signal mask layer is a synthetic graphene layer.

Preferably, there are three conductor assemblies.

Preferably, the conductor assembly comprises a plurality of conductive wires.

Preferably, the conductive wire is a copper wire, an enameled copper wire, or a nickel-clad copper wire.

Preferably, the cross-section of the conductive wire perpendicular to the lengthwise direction of the conductive wire is in a circular shape.

The present invention further discloses a leakage detection circuit breaker, comprising a housing and a plurality of pins, and further comprising a control circuit board installed in the housing, a leakage detection breaker assembly, a plurality of cable connectors and a plurality of conductive output elements, and the conductive output element and the control circuit board being coupled to each other via signal, and the housing having a press button, and the leakage detection circuit breaker assembly and the control circuit board being coupled to each other via signal; and the leakage detection circuit breaker assembly being provided for controlling and disconnecting the press button when a leakage current occurs; and the cable connector being connected with the aforementioned cable with a detection function.

The plurality of conductive output elements and the plurality of pins are configured to be corresponsive to one another respectively, and the press button is provided for controlling a terminal of the conductive output element to connect to the pin via signal, and another terminal of the conductive output element is soldered to the cable connector.

Preferably, the housing includes an upper housing and a lower housing, and the lower housing includes a fixed column protruded therefrom, and the upper housing is provided with a notch, and the fixed column is installed into the notch to define a snap-in position at the bottom of the notch, and another terminal of the conductive output element is inserted into the snap-in position.

Preferably, the lower housing has a ridge ring protruded from the lower housing, and the upper housing has a connection slot formed on the upper housing, and after the upper housing and the lower housing are assembled, the ridge ring is installed to the connection slot.

Preferably, the housing includes a waterproof element installed in the housing, and the waterproof element includes a waterproof gasket; and the housing has a fixed seat disposed in the housing and detachably installed to the lower housing, and the waterproof gasket is installed between the fixed seat and the lower housing, and the lower housing has a press button hole for exposing the press button, and the waterproof gasket is provided for sealing and separating the press button hole from the internal space of the housing.

Preferably, the waterproof gasket is installed with a U-shaped elastic ring, and the U-shaped elastic ring has a via, and a limit slot is formed on a hole wall of the via, and the outer periphery of the press button is installed with a limit ring, and after the press button passes through the via, the limit ring is installed into the limit slot.

Preferably, the waterproof gasket has a sealing ridge protruded from the waterproof gasket, and the sealing ridge is provided for abutting against the inner wall of the lower housing.

Preferably, the waterproof gasket has a fence protruded from a side of the waterproof gasket which is in contact with the fixed seat, and the fence forms an installation slot, and the fixed seat is limited in the installation slot.

Preferably, the leakage detection circuit breaker assembly includes a current breaker, a breaker support, a connecting element, a connection reset element and a press button reset element, and the pin has a fixed contact point; and the press button reset element is sheathed on the outer periphery of the press button and provided for resetting the press button, and the connection reset element is provided for restoring the position of the connecting element; the current breaker is installed to the control circuit board and coupled to the control circuit board via signal, and the connecting element is movably installed to the breaker support, and an output terminal of the current breaker is installed to the connecting element for driving the movement of the connecting element; and the breaker support comprises a control arm disposed on two sides of the breaker support separately, and the connecting element has a drive slot formed therein, and the bottom of the press button has a snap slot; when the press button is shut, the slot wall of the drive slot is snapped into the snap slot and the press button drives the connecting element to move, and the connecting element is provided for driving the breaker support to move, and the control arm of the breaker support is provided for driving the conductive output element to be in contact with the fixed contact point.

Preferably, the breaker support has a through slot, and the connecting element is movably installed to the through slot, and the connecting element has a limit bump, and the connection reset element has an end sheathed on the limit bump and the other end abutting against the breaker support.

The present invention has the following advantages:
1. If the first insulating layer cladded by the signal detection layer is damaged or cracked, then the conductor assembly will be exposed from the first insulating layer, and the conductor assembly will be electrically connected to the signal detection layer to generate a short-circuit signal, and the signal detection layer will timely transmit the short-circuit signal to an external monitor, so as to maintain the cable timely.
2. The signal detection layer can be used for transmitting signal, so that it can produce a mask effect to the conductor assembly.
3. The structure of the present invention is simple and capable of completing the transmission and detection of the signals without requiring the installation of any extra sensor, and thus the structure of the invention is highly practical.

BRIEF DESCRIPTION OF NUMERALS USED IN THE DRAWINGS (FIGS. 1 TO 17)

1—Conductor assembly, 2—First insulating layer, 3—Second insulating layer, 4—Signal detection layer, 5—Signal mask layer, 6—Conductive wire, 100—Conductor module, 200—First insulating layer, 300—Second insulating layer, 400—Signal detection layer, 500—Mask signal layer, and 600—Conductive wire.

DESCRIPTION OF THE PREFERRED EMBODIMENTS

The technical contents of the present invention will become apparent with the detailed description of preferred embodiments accompanied with the illustration of related drawings as follows. It is intended that the embodiments and figures disclosed herein are to be considered illustrative rather than restrictive.

Figure 1:
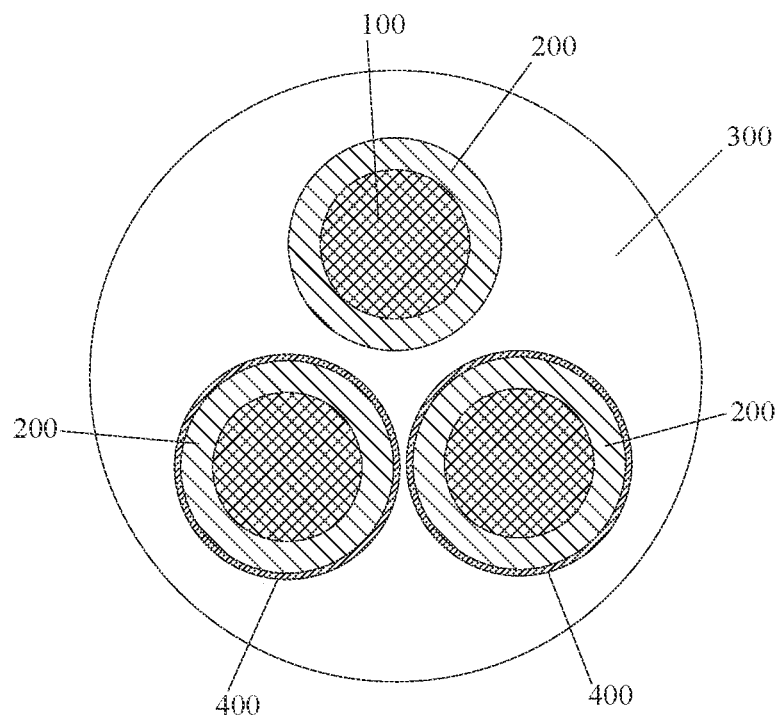
FIG. 1 is a schematic view of the structure of a first embodiment of this invention.

With reference to FIG. 1 for a cable with a signal detection function in accordance with the first embodiment of the present invention, the cable comprises a plurality of cores, each having a conductor assembly 100 and a first insulating layer 200 cladded in the outer periphery of the conductor assembly 100. The cable further comprises a second insulating layer 300 and a plurality of signal detection layers 400, and the signal detection layer 400 is provided for transmitting signal data; the signal detection layer 400 and the plurality of cores are disposed in the second insulating layer 300; the signal detection layer 400 is cladded with a plurality of cores, and if the first insulating layer 200 inside the signal detection layer 400 is damaged, the signal detection layer 400 will be electrically coupled to the conductor assembly 100.

Specifically, when the structure of this embodiment is applied to a power cable, the power cable includes three cores: a live line, a ground line and a neutral line. In this embodiment, the outer peripheries of two of the cores are cladded with a signal detection layer 400. In general, the outer peripheries of the live and neutral lines are cladded with the signal detection layer 400, so that if the first insulating layer 200 of the live line or the neutral line is cracked or damaged, then the conductor assembly 100 in the first insulating layer 200 will be electrically coupled to the signal detection layer 400 to generate a short-circuit signal, and then the signal detection layer 400 will transmit the short-circuit signal to an external monitor to prompt that there is a failure inside the power cable, so as to facilitate technicians or related staffs to maintain or replace the power cable and reduce the chance of electrical accidents.

Figure 2:
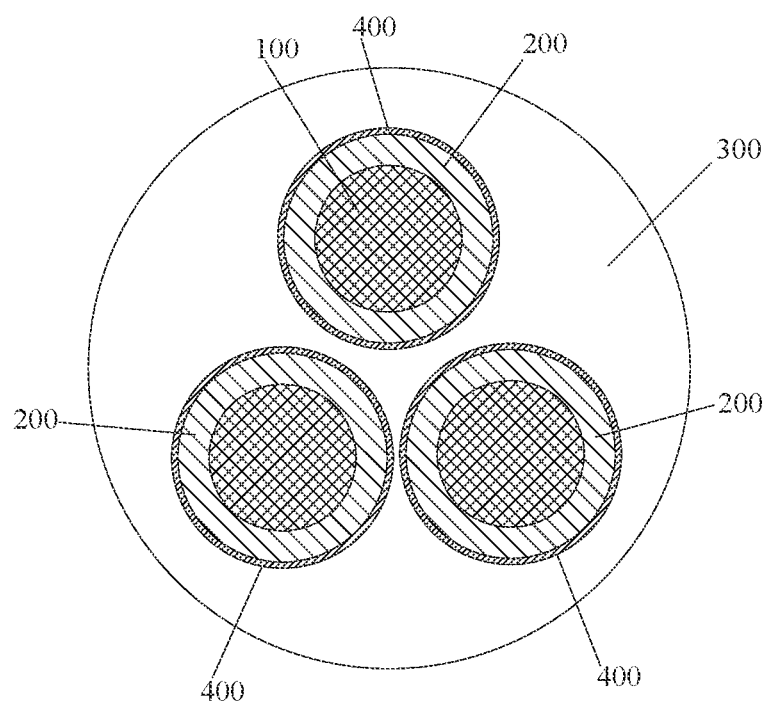
FIG. 2 is another schematic view of the structure of the first embodiment of this invention.

Further, when this embodiment is applied to other cables, signal detection layer 400 can be cladded on the outer periphery of all cores as shown in FIG. 2.

Figure 3:
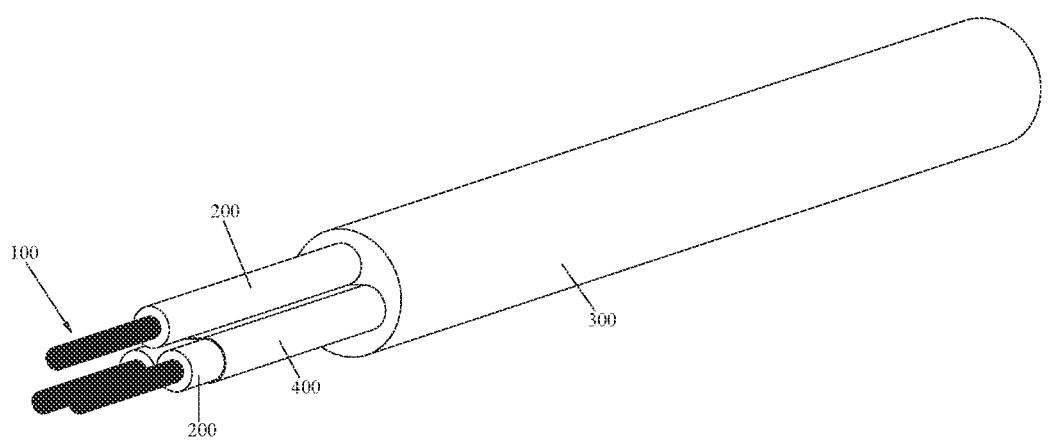
FIG. 3 is a schematic view of the structure of a second embodiment of this invention.
Figure 4:
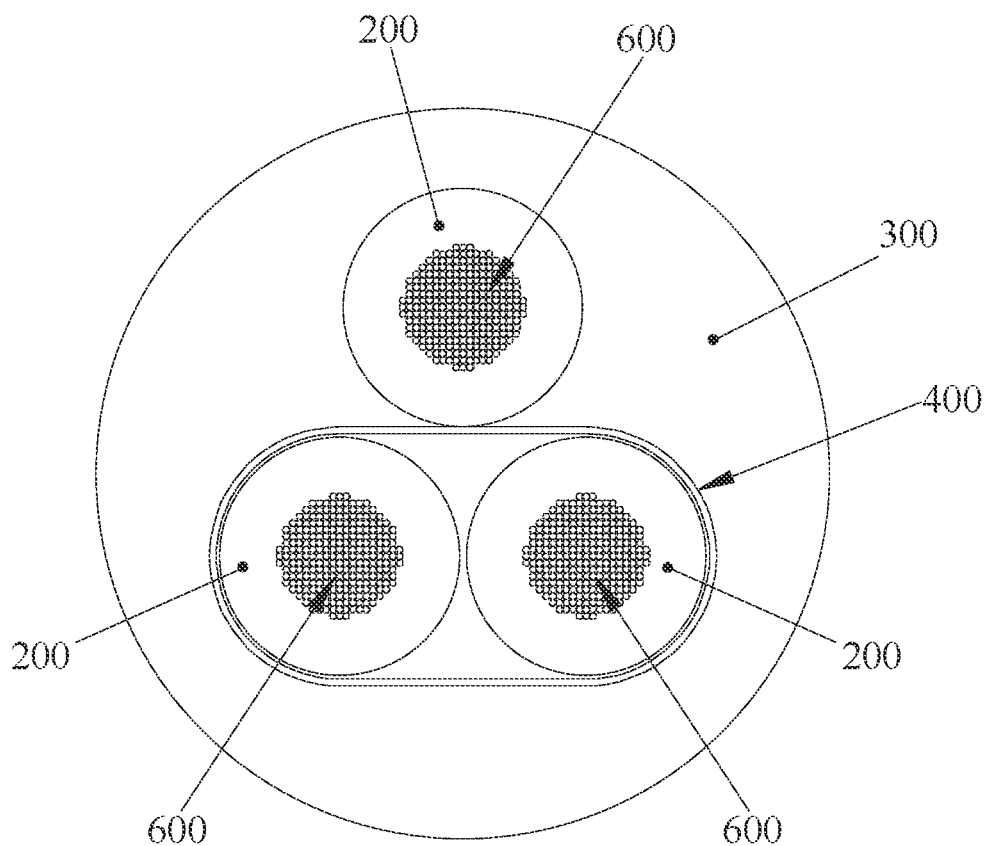
FIG. 4 is a cross-sectional view of FIG. 3.

With reference to FIGS. 3 and 4 for a cable with a signal detection function in accordance with the second embodiment of the present invention, the signal detection layer 400 is cladded with at least two cores, and the first insulating layer 200 disposed in the signal detection layer 400 abuts against the inner wall of the signal detection layer 400. If the first insulating layer 200 in the signal detection layer 400 is damaged, the signal detection layer 400 will be electrically coupled to the conductor assembly 100, wherein there are preferably at least three conductor assemblies 100.

Figure 5:
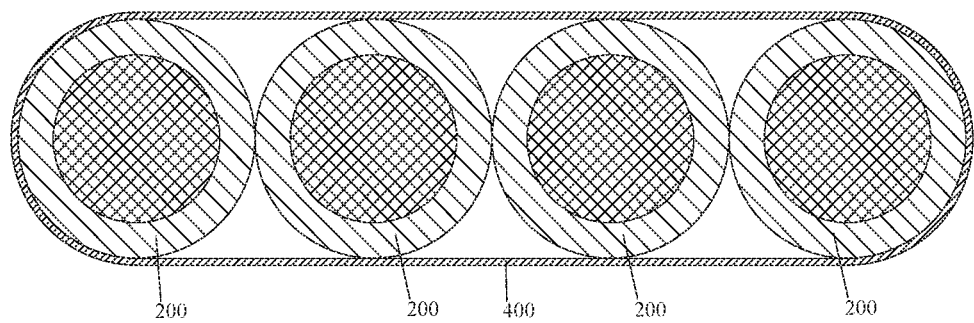
FIG. 5 is a schematic view of the structure with a plurality of first insulating layers and a conductor assembly cladded in a signal detection layer in accordance with the second embodiment of the present invention.

In FIG. 4, the other periphery of each conductor assembly 100 is cladded with the first insulating layer 200 to form the core, and the cores will not interfere with each other, and the signal detection layer 400 of this embodiment has the electrically conductive property and is capable of transmitting signals, and thus it also belongs to the mask layer of the core. In this embodiment, at least two cores is cladded with the signal detection layer 400, and the two cores abut against each other, and there is at least one abutting point between the signal detection layer 400 and the core cladded with the signal detection layer. To clad the core tightly in a practical application, the structure as shown in FIGS. 4 and 5 is designed, wherein the semi-circumference of the core actually abuts against both ends of the signal detection layer 400, so that the signal detection layer 400 can achieve the effect of transmitting and detecting signals with the smallest possible area to lower costs. When one or more first insulating layers 200 in the signal detection layer 400 are damaged, the conductor assembly 100 cladded with the first insulating layer 200 has a higher chance of exposing from the first insulating layer 200 and forming a short circuit between the conductor assembly 100 and the conductor assembly 100 and contacting with the signal detection layer 400 to generate a short-circuit signal, and the signal detection layer 400 will transmit the short-circuit signal to an external monitor, so as to facilitate technicians or related personnel to know about the situation and take corresponding actions timely and reduce losses. Compared with the core cladded with the signal detection layer 400 on its outer periphery, the signal detection layer 400 of this embodiment contains at least two core installed therein to reduce the use of manufacturing materials of the signal detection layer 400 as shown in FIG. 5. When there are two or more cores, the periphery of the core no longer need to clad the signal detection layer 400, so that the manufacturing cost of the signal detection layer 400 can be lowered significantly.

Figure 6:
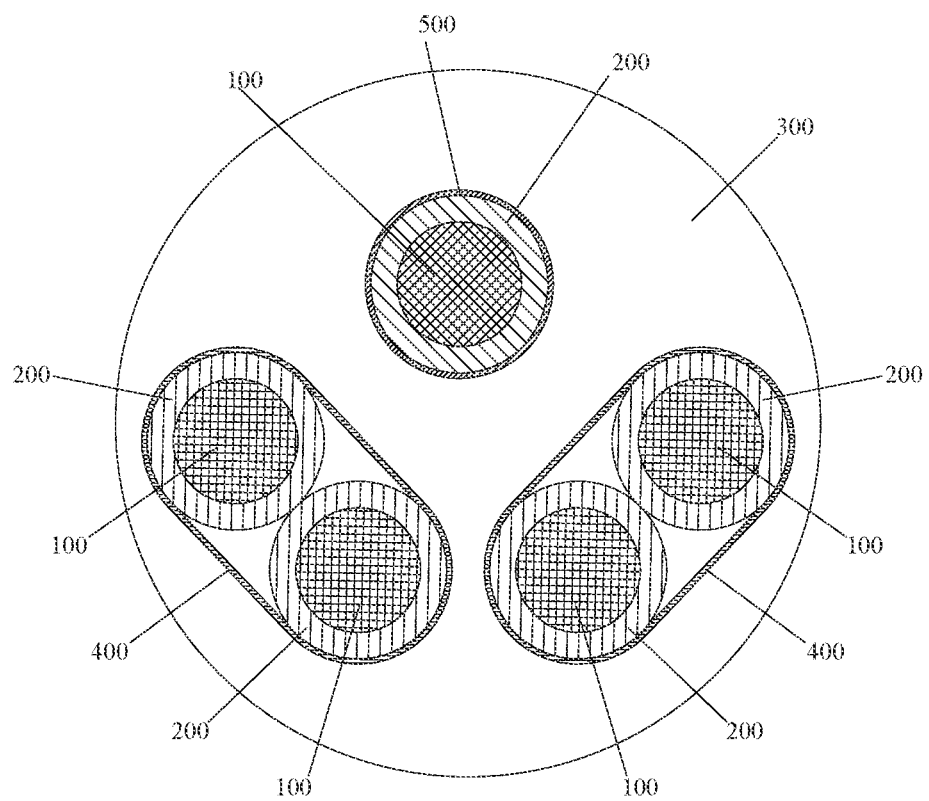
FIG. 6 is a schematic view of the structure with a plurality of signal detection layer in accordance with the second embodiment of this invention.

Of course, there may be a plurality of signal detection layers 400 in this embodiment as shown in FIG. 6.

Preferably, the signal detection layer 400 of this embodiment is a synthetic graphene layer. In other words, the signal detection layer 400 is made of graphene, and the graphene layer of this embodiment is manufactured by synthesis, but not by spraying.

This embodiment provides a cable with a signal detection function as shown in FIG. 4, and the first insulating layer 200 disposed outside the signal detection layer 400 abuts against the outer periphery of the signal detection layer 400.

Specifically, the periphery of the first insulating layer 200 is preferably configured to be abutting against the signal detection layer 400, so that if the first insulating layer 200 at the periphery is cracked or damaged, the exposed conductor assembly 100 and the signal detection layer 400 can generate a short-circuit signal, and the signal detection layer 400 transmits the short-circuit signal to an external monitor to facilitate maintaining the cable timely. This embodiment uses a signal detection layer 400 to detect a plurality of cores, so that the cable of this embodiment has the features of a simpler structure and a lower cost. During practical applications, the core outside the signal detection layer is also possibly not contacted with the signal detection layer. For example, if the external core is a ground line, the cable can be designed without any contact point according to the actual situation.

This embodiment provides a cable with a signal detection function as shown in FIGS. 3 and 4, and the conductor assembly 100 comprises a plurality of conductive wires 600, not just can be formed into a standalone conductive wire 600 only, but also can be twisted and braided into a conductor assembly 100 as well, wherein the conductive wire 600 is a copper wire, an enameled copper wire or a nickel-clad copper wire that can improve the durability and conductivity of the conductive wire 600. Preferably, the cross-section of the conductive wire 600 perpendicular to the lengthwise direction of the conductive wire is in a circular shape. Of course, a rectangular shape or any other shape can be adopted according to actual situations.

Figure 7:
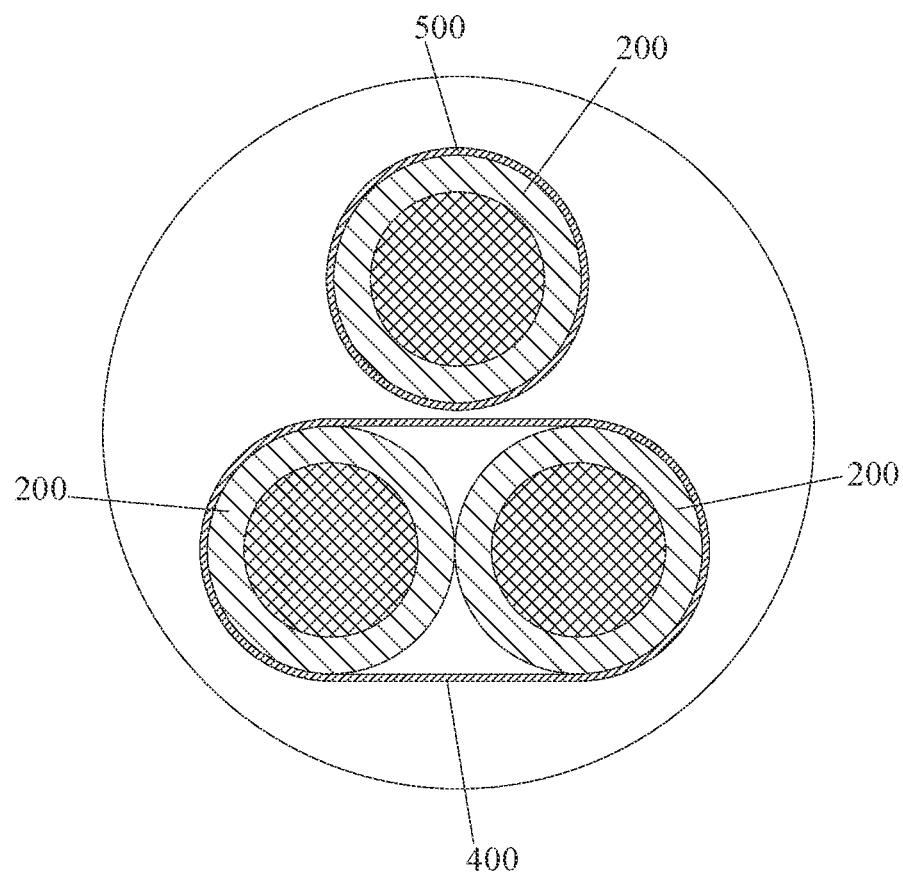
FIG. 7 is a schematic view of the structure of a third embodiment of this invention.

With reference to FIG. 7 for a cable with a signal detection function in accordance with the third embodiment of the present invention, the outer periphery of the first insulating layer 200 disposed outside the signal detection layer 400 is cladded with a signal mask layer 500. Preferably, the signal mask layer 500 is also a synthetic graphene layer.

Figure 8:
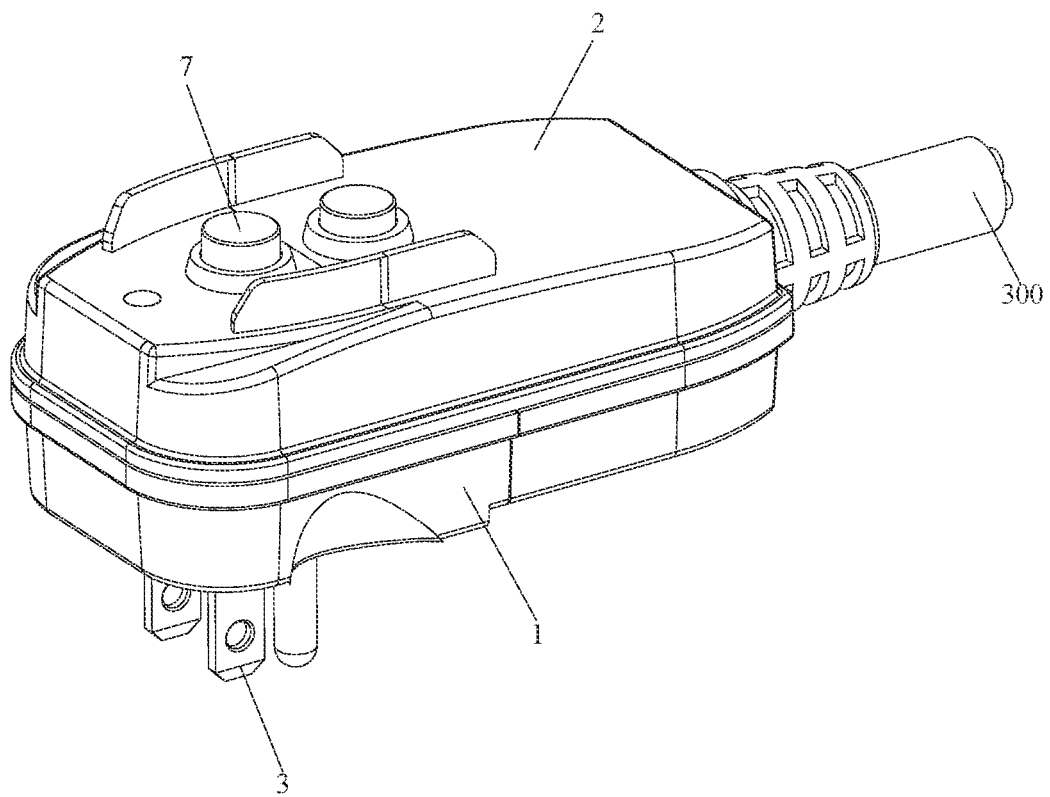
FIG. 8 is a schematic view of the structure of a fourth embodiment of this invention.
Figure 9:
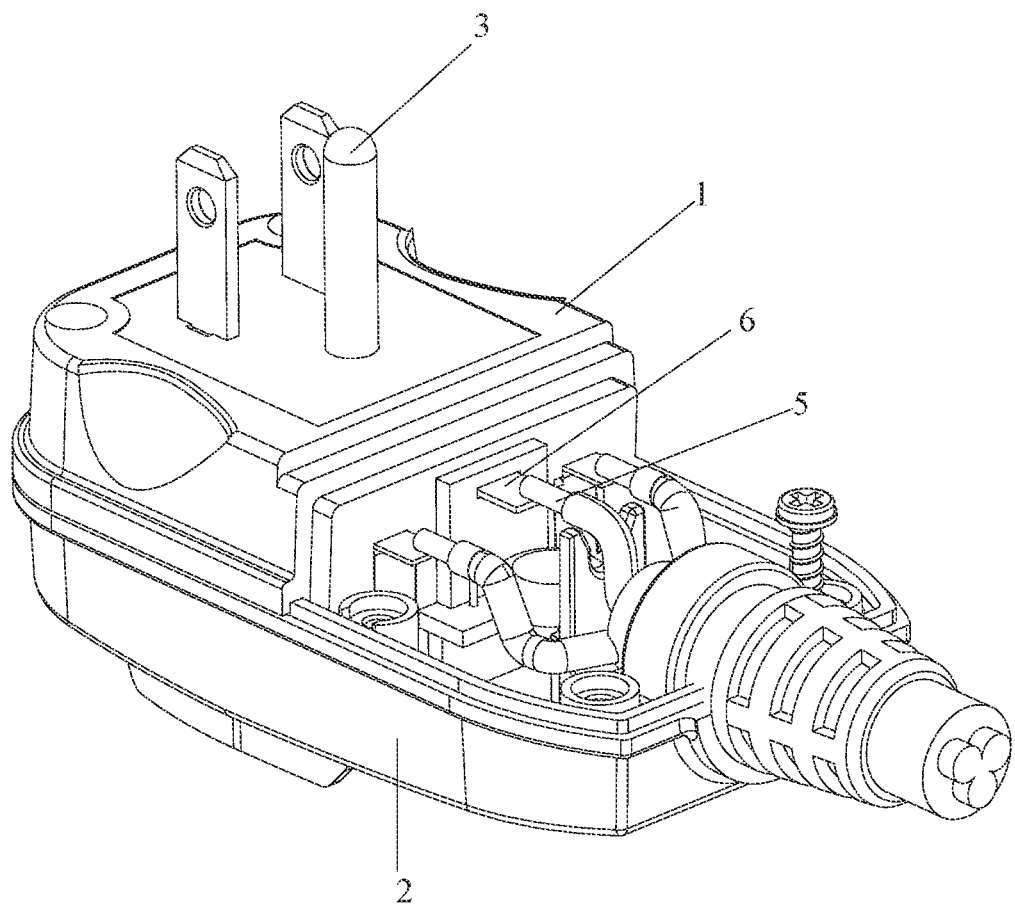
FIG. 9 is a schematic view of the structure of the fourth embodiment of this invention after a portion of the upper housing is hidden.
Figure 10:
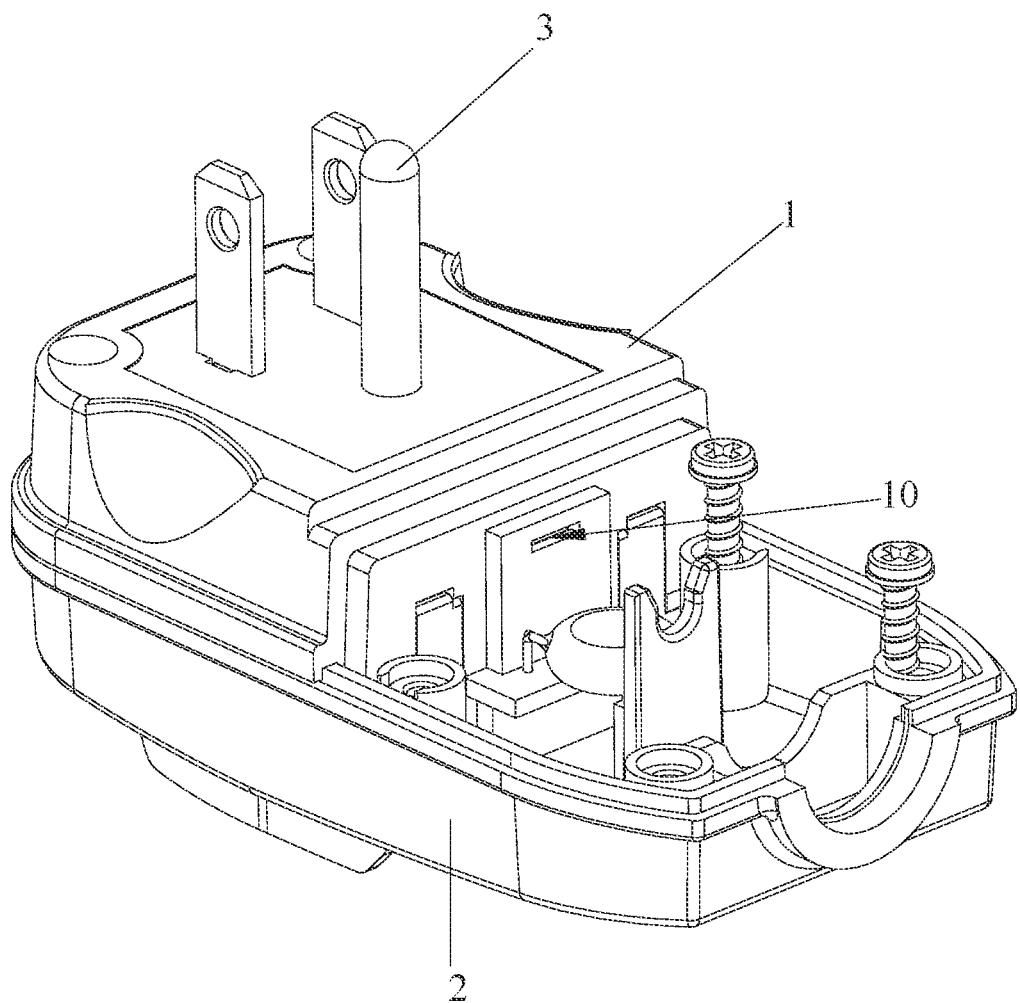
FIG. 10 a schematic view of the structure of the fourth embodiment of this invention after a portion of the upper housing and the cable connector is hidden.

Specifically, the periphery of the core of the signal detection layer 400 of this embodiment has a signal mask layer 500 made of synthetic graphene and can achieve the effects of masking as well as detecting damages of the core and transmitting signals With reference to FIGS. 11 to 15 for a leakage detection circuit breaker in accordance with the fourth embodiment of this disclosure, the leakage detection circuit breaker includes a housing and a plurality of pins 3, and further includes a control circuit board 4, a leakage detection circuit breaker assembly, a plurality of cable connectors 5 and a plurality of conductive output elements 6 which are installed in the housing, and the conductive output element 6 and the control circuit board 4 are coupled to each other via signal, and the housing is provided with a press button 7, and the leakage detection circuit breaker assembly and the control circuit board 4 are coupled to each other via signal; the leakage detection circuit breaker assembly is provided for controlling the disconnection by the press button 7 when a leakage current occurs; the plurality of conductive output elements 6 and the plurality of pins 3 are corresponsive with one other, and the press button 7 is provided for controlling the pin 3 to be connected to a terminal of the conductive output element 6 via signal, and the other end of the conductive output element 6 is soldered to the cable connector. In FIG. 8, the cable connectors 5 are connected to the cable with a detection function of the first embodiment, and the plurality of cable connectors 5 of this embodiment can be selected to be a live wire, a ground wire and a neutral wire configured to be corresponsive to the three cores of the cable with a detection function of the first embodiment, so that this embodiment can perform the detection of the circuit by the cable with a detection function in addition to detecting the safety of the circuit by the leakage detection circuit breaker, so as to further enhance the safety of use.

Figure 11:
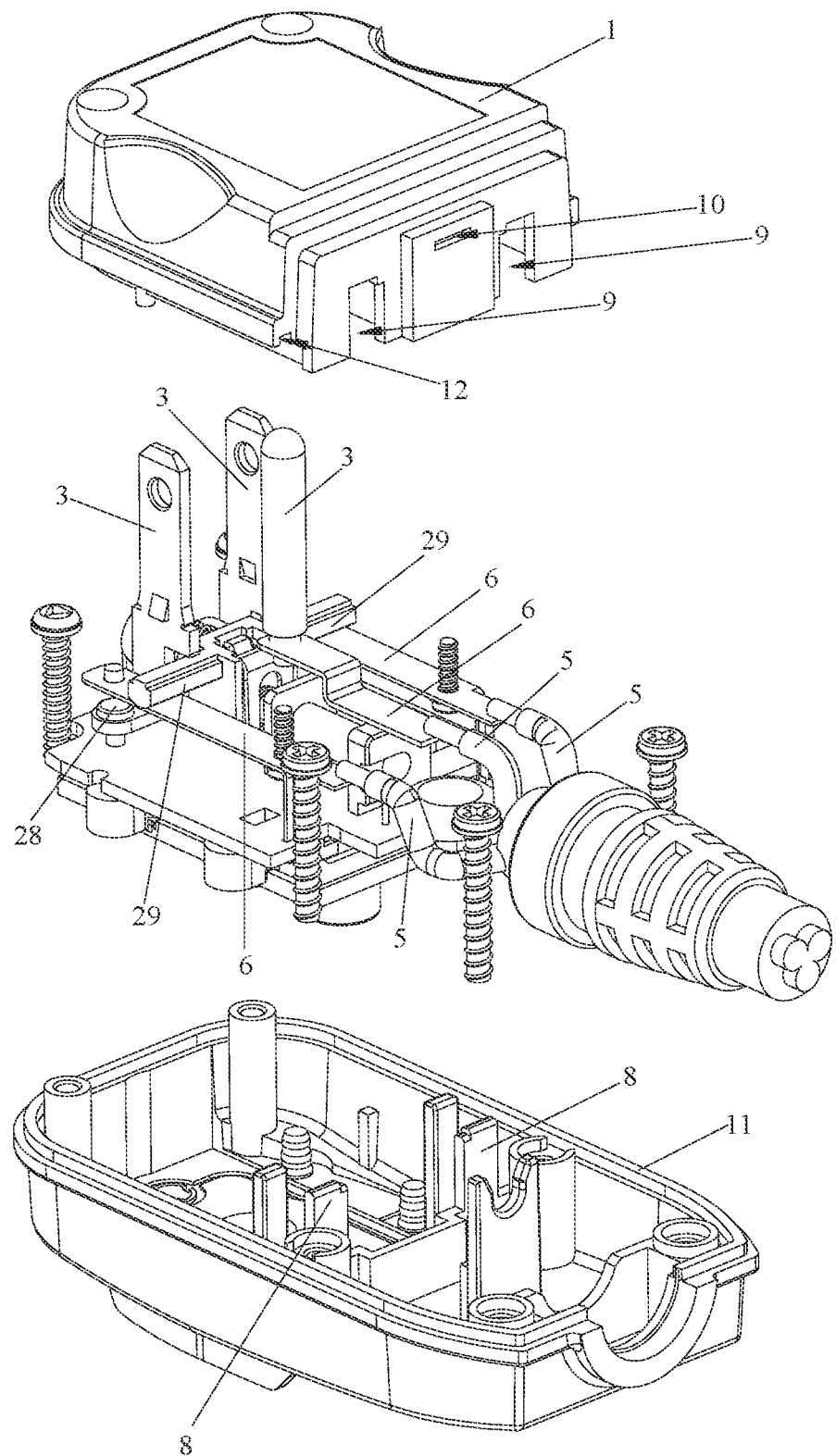
FIG. 11 is an exploded view of the fourth embodiment of this invention.
Figure 17:
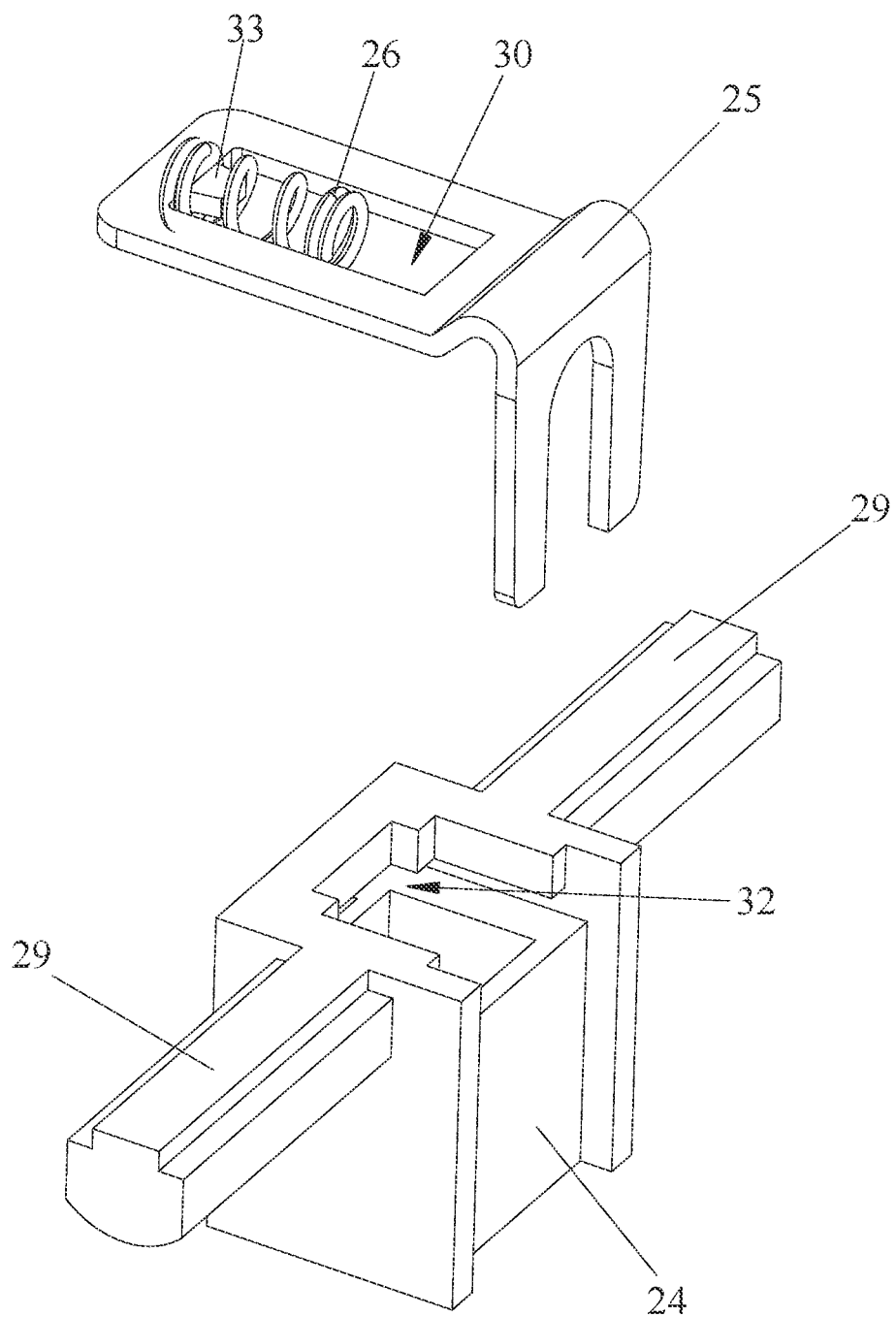
FIG. 17 is an exploded view showing a connecting element, a connection reset element and a breaker support of in accordance with the fourth embodiment of this invention.

Specifically, the conductive output element 6 of this embodiment is installed in the housing by an installation method as shown in FIGS. 17 and 11, wherein the housing includes an upper housing 1 and a lower housing 2, and the lower housing 2 has a fixed column 8 protruded from the lower housing 2, and the upper housing 1 has a notch 9, and the fixed column 8 is installed into the notch 9 to define a snap-in position 10 at the bottom of the notch 9, and another end of the conductive output element 6 is inserted into the snap-in position 10, so that after the other end of the conductive output element 6 is passed into the snap-in position 10, the conductive output element 6 can be secured om the housing. Besides the cable connector 5, the structure of this embodiment can be produced independently, while the cable connector 5 can also be produced independently. When needed, the cable connector 5 can be welded to the conductive output element 6 instead of soldering, so as to achieve the effects of facilitating the production and assembling process and improve the efficiency of this embodiment.

Figure 12:
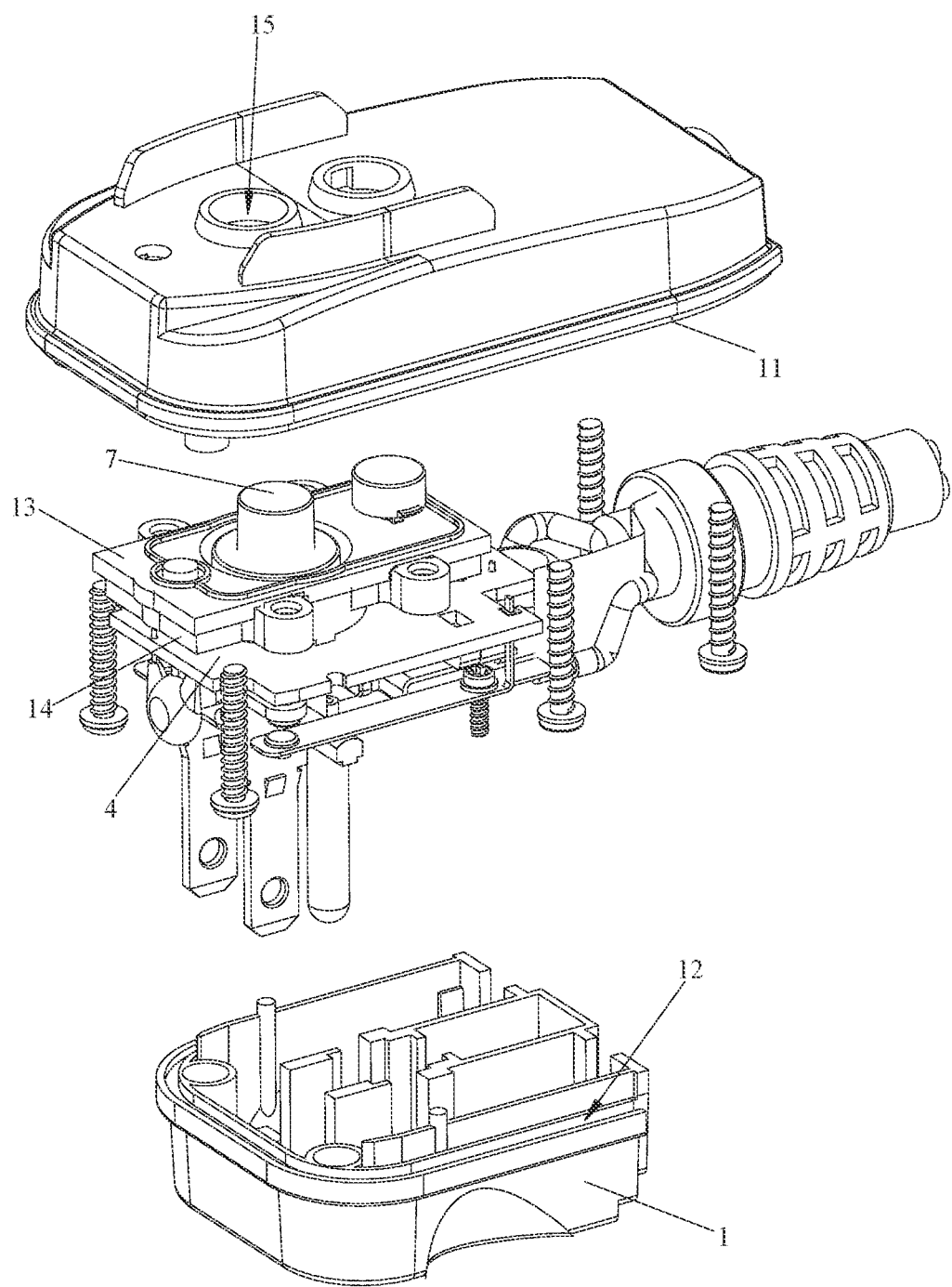
FIG. 12 is another exploded view of the fourth embodiment of this invention.

Further, in FIGS. 11 and 12, the lower housing 2 has a ridge ring 11 protruded from the lower housing 2, and the upper housing 1 has a connection slot 12, and after the upper housing 1 and the lower housing 2 are assembled, the ridge ring 11 is installed to the connection slot 12.

Specifically, the housing can be assembled more securely by the configuration of the ridge ring 11 and the connection slot 12 to provide better tightness, and the connection slot 12 can further install a sealing ring to improve the airtight and waterproof effects.

Figure 13:
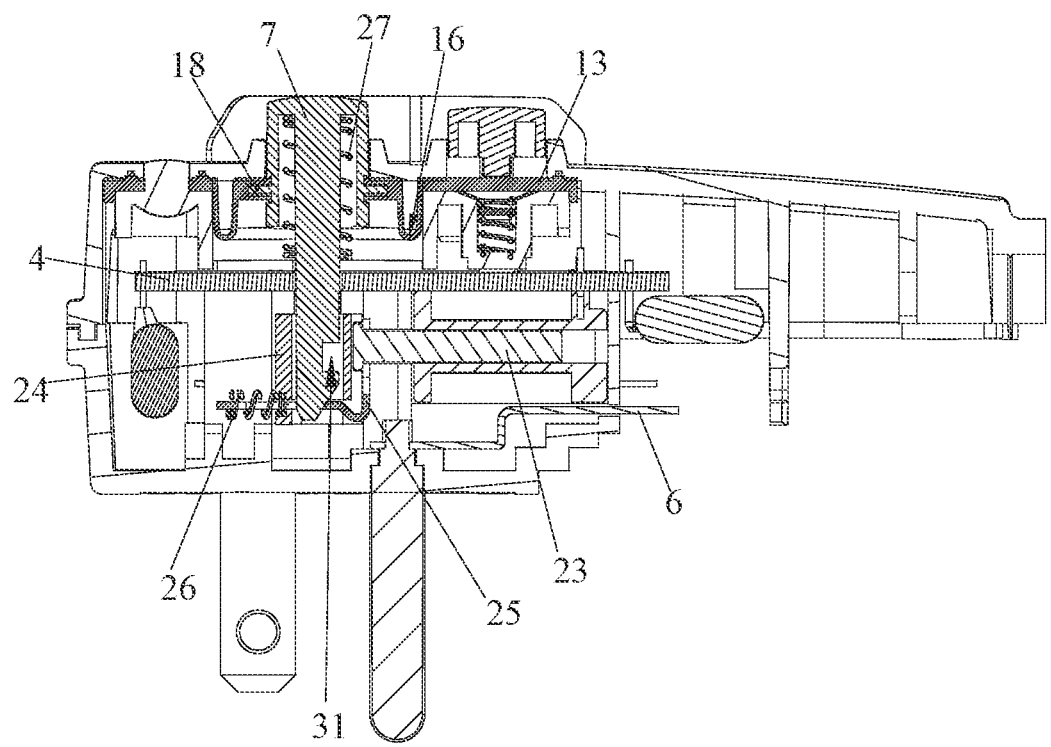
FIG. 13 is a first cross-sectional view of the fourth embodiment of this invention.
Figure 14:
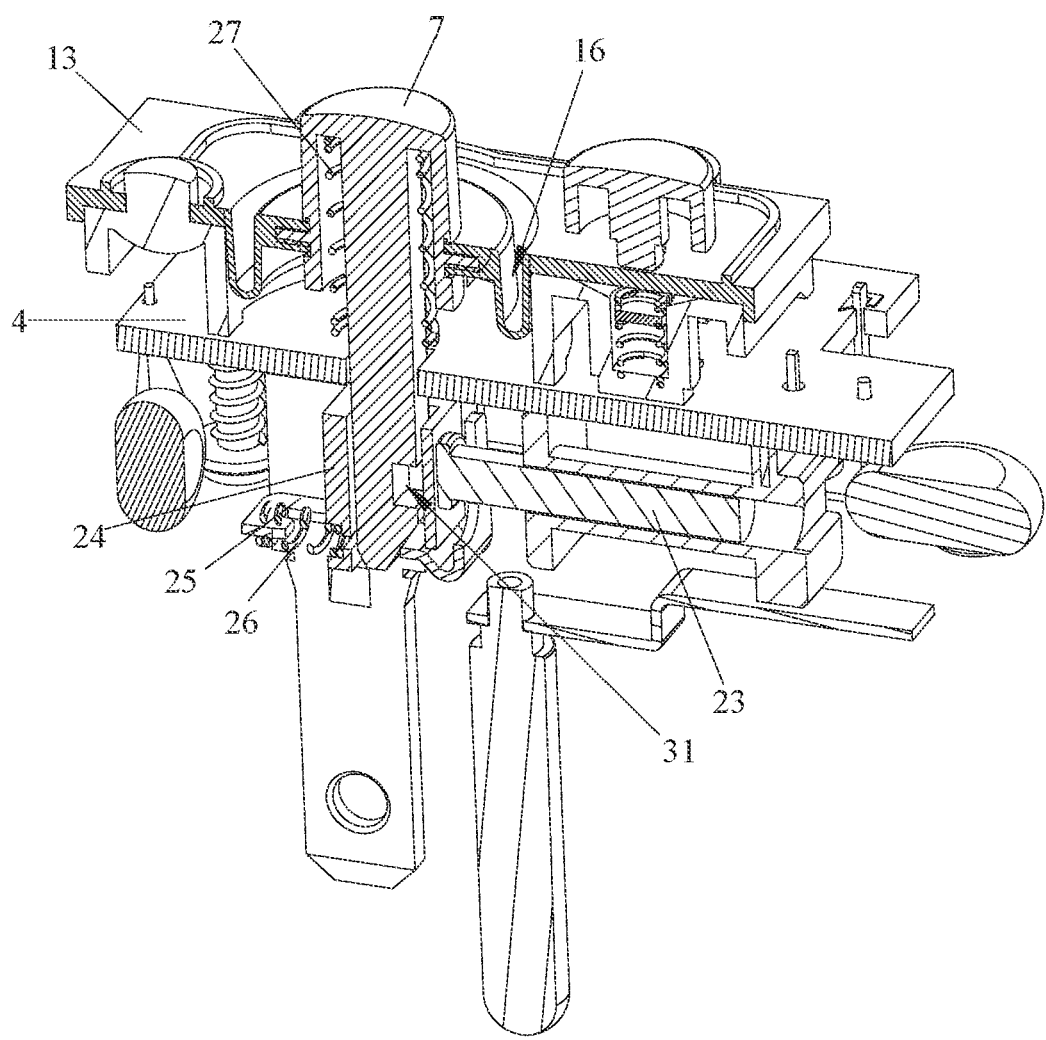
FIG. 14 is a second cross-sectional view of the fourth embodiment of this invention.

This embodiment provides a leakage detection circuit breaker as shown in FIGS. 12 to 16, and the housing includes a waterproof element installed in the housing, and the waterproof element includes a waterproof gasket 13; the housing includes a fixed seat 14 disposed in the housing and detachably installed to the lower housing 2, and the waterproof gasket 13 is installed between the fixed seat 14 and the lower housing 2, and the lower housing 2 has a press button hole 15 for exposing the press button 7, and the waterproof gasket 13 is provided for sealing and separating the press button hole 15 from the internal space of the housing Specifically, the press button 7 of this embodiment further includes a waterproof element as shown in FIG. 14, and the waterproof gasket 13 is elastic and includes a U-shaped elastic ring 16 disposed at a position connecting to the press button 7. Optionally, the U-shaped elastic ring 16 has a via 17, and a limit slot 19 is formed on the hole wall of the via 17, and a limit ring 18 is installed around the outer periphery of the press button 7, After the press button 7 is passed through and installed to the via 17, the limit ring 18 is installed in the limit slot 19, so that during the process of pressing the press button 7 upward or downward in the direction as shown in FIGS. 13 and 14, the press button 7 will be limited by the limit ring 18, and the press button 7 will not be separated from the waterproof gasket 13. Since the U-shaped elastic ring 16 is elastic, it can be stretched upwardly or downwardly with the press button 7, without restricting the function of the press button 7, but it can also maintain the waterproof effect.

Figure 15:
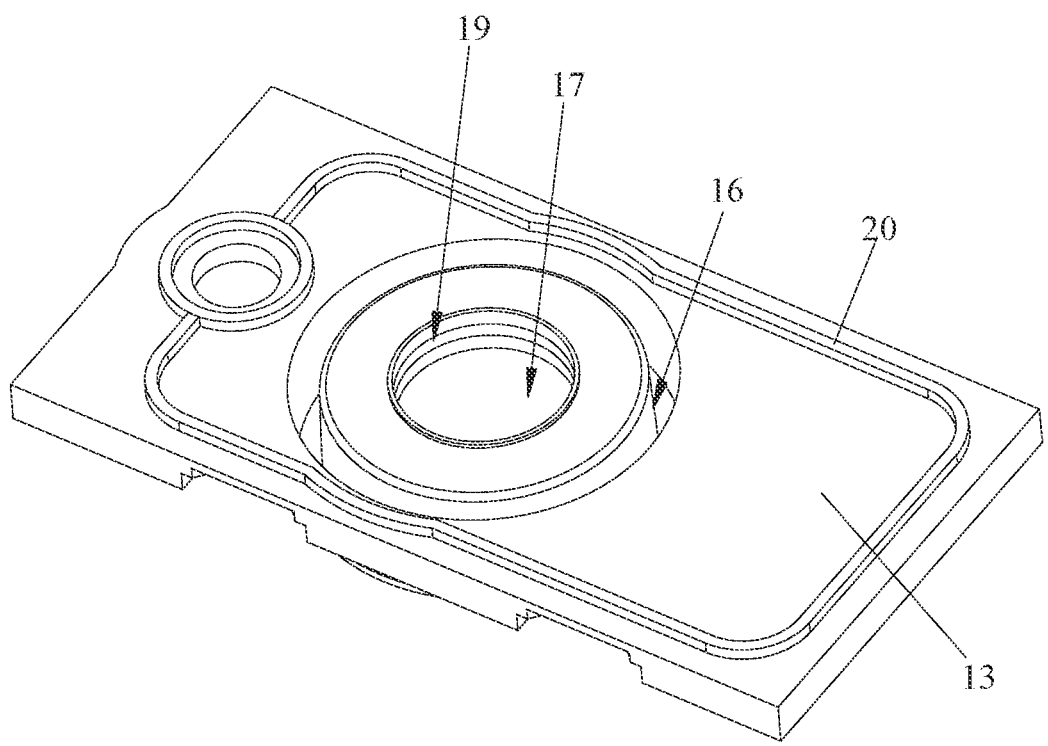
FIG. 15 is a schematic view of the structure of a waterproof gasket in accordance with the fourth embodiment of this invention.

Further, in FIGS. 14 and 15, the waterproof gasket 13 has a sealing ridge 20 protruded from the waterproof gasket 13, and the sealing ridge 20 is provided for abutting against the inner wall of the lower housing 2 to improve the sealing and waterproof performance between the waterproof gasket 13 and the housing.

Figure 16:
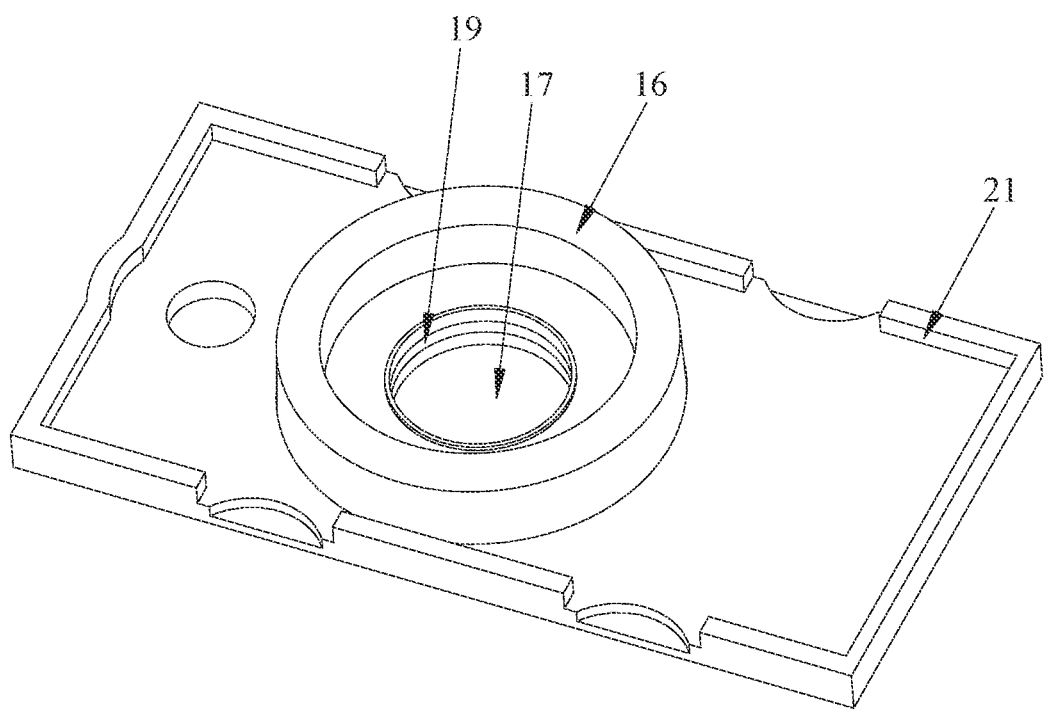
FIG. 16 is another schematic view of the structure of a waterproof gasket in accordance with the fourth embodiment of this invention.

Further, in FIG. 16, the waterproof gasket 13 has a fence 21 disposed on a side of the waterproof gasket 13 which is in contact with the fixed seat 14, and the fence 21 forms an installation slot (not shown in the figure), and the fixed seat 14 is limited in the installation slot to assure the assembly stability between the fixed seat 14 and the waterproof gasket 13. After the fixed seat 14 is assembled to the housing, the waterproof gasket 13 can be fixed to position to prevent the waterproof effect from being affected adversely by the displacement of the waterproof gasket 13.

With reference to FIGS. 11 to 14 for a leakage detection circuit breaker in accordance with this embodiment, the leakage detection circuit breaker assembly includes a current breaker 23, a breaker support 24, a connecting element 25, a connection reset element 26 and a press button reset element 27, and the pin 3 has a fixed contact point 28; the press button reset element 27 is sheathed on the outer periphery of the press button 7 and provided for resetting the press button 7, and the connection reset element 26 is provided for restoring the position of the connecting element 25, wherein the current breaker 23 is specifically an electromagnet and a switch installed in the power circuit. If a leakage current occurs, two ends of the current breaker 23 will generate a voltage difference to produce a magnetic force which can attract the connecting element 25 to move the connecting element 25; the current breaker 23 is installed to the control circuit board 4 and connected to the control circuit board 4 via signal, and the connecting element 25 is movably installed to the breaker support 24, and the output terminal of the current breaker 23 is installed to the connecting element 25 ad provided for driving the movement of the connecting element 25; wherein two sides of the breaker support 24 are installed with a control arm 29 separately, and the connecting element 25 has a drive slot 30, and the bottom of the press button 7 is provided with a snap slot 31; when the press button 7 is shut, the slot wall of the drive slot 30 will be snapped into the snap slot 31 and the press button 7 will drive the connecting element 25 to move, and the connecting element 25 is provided for driving the breaker support 24 to move, and the control arm 29 of the breaker support 24 is provided for driving the conductive output element 6 to be in contact with the fixed contact point 28. Optionally, the breaker support 24 has a through slot 32, and the connecting element 25 is movably installed to the through slot 32, and the connecting element 25 has a limit bump 33, and the connection reset element 26 has an end sheathed on the limit bump 33 and the other end abutting against the breaker support 24.

Specifically, the design of the control circuit board 4 of this embodiment includes the corresponding leakage circuit detection circuit and leakage circuit detection element, similar to the mutual inductance coils, for sensing whether the live wire and the neutral wire have a leakage current. When the press button 7 is pressed under a normal operation as shown in FIG. 13, during the process of descending the press button 7, the inclined plane of the bottom of the press button 7 will squeeze and press the connecting element 25 to move and snap into the snap slot 31 of the press button 7. During the process of resetting the press button 7, the connecting element 25 will be driven to move upward, and the breaker support 24 will be driven by the connecting element 25 to move upward, so that the two control arms 29 of the breaker support 24 will press the conductive output element 6 upward to drive the conductive output element 6 to be in contact with the fixed contact point 28 of the pin 3 to conduct the pin 3 with the cable connector 5 in order to output a voltage. If a leakage current occurs, the leakage circuit detection element of the control circuit board 4 will generate an induction signal, and the current breaker 23 will produce a magnetic force and move to the right (in the direction as indicated in FIG. 13) to drive the connecting element 25 to move to the right, so as to separate the connecting element 25 from the press button 7. The press button 7 restores its position by the driving of the press button reset element 27, so that the connecting element 25 and the breaker support 24 also moves downward to restore their position, while the connection reset element 26 is driving the connecting element 25 to move leftward to restore its position, and thus the conductive output element 6 is not in contact with the fixed contact point 28, and the pin 3 is not conducted with the cable connector 5, In this way, no voltage or current will be generated, and the electric appliance connected to the leakage detection circuit breaker 23 of this embodiment can be safer to reduce accidents.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A leakage detection system comprising:
    a cable with a signal detection function, the cable comprising:
        a plurality of cores, each core having a conductor assembly and a first insulating layer covering an outer periphery of the conductor assembly;
        a second insulating layer; and
        a plurality of signal detection layers, wherein each signal detection layer is provided for transmitting signal data,
        wherein the signal detection layers and the cores are disposed in the second insulating layer; and one of the signal detection layers is cladded onto at least one of the cores,
        wherein when the first insulating layer is damaged, one of the signal detection layers will be electrically coupled to the conductor assembly of one of the cores,
    wherein each signal detection layer is a synthetic graphene layer; and
    a leakage detection circuit breaker coupled with the cable, the leakage detection circuit breaker comprising:
        a housing having a press button;
        a plurality of pins:
        a control circuit board installed in the housing;
        a leakage detection circuit breaker assembly, the leakage detection circuit breaker assembly coupled with the control circuit board via a signal;
        a plurality of cable connectors coupled with the cable; and
        a plurality of conductive output elements: each conductive output element coupled with the control circuit board via a signal; and the leakage detection circuit breaker assembly is provided for controlling and disconnecting the press button when a leakage current occurs; and the conductive output elements and the pins are configured to be corresponsive to one another respectively, and the press button is provided for controlling a first terminal of each conductive output element to couple to a respective pin via a signal, and a second terminal of each conductive output element is soldered to a respective cable connector,
    wherein the housing comprises an upper housing and a lower housing, and the lower housing comprises a fixed column protruding therefrom, and the upper housing is provided with a notch, and the fixed column is installed into the notch to define a snap-in position with a bottom of the notch, and a third terminal of each conductive output element is plugged into the snap-in position,
    wherein the housing comprises a waterproof element installed therein, and the waterproof element comprises a waterproof gasket; and the housing comprises a fixed seat disposed therein and detachably installed to the lower housing, and the waterproof gasket is installed between the fixed seat and the lower housing, and the lower housing comprises a press button hole formed thereon and provided for exposing the press button, and the waterproof gasket is provided for sealing and separating the press button hole and an internal space of the housing,
    wherein the waterproof gasket comprises a fence protruding from a side of the waterproof gasket which is in contact with the fixed seat, and the fence forms an installation slot, and the fixed seat is limited in the installation slot.

2. The leakage detection system of claim 1, wherein one of the signal detection layers is cladded onto at least two of the cores, with the first insulating layer of each of the cores abutting against an inner wall of said signal detection layer.

3. The leakage detection system of claim 1, wherein a signal mask layer is cladded onto an outer periphery of one of the cores, wherein the outer periphery is not covered by one of the signal detection layers.

4. The leakage detection system of claim 3, wherein the signal mask layer is a synthetic graphene layer.

5. The leakage detection system of claim 1, wherein the plurality of cores comprises at least three cores.

6. The leakage detection system of claim 1, wherein the conductor assembly of each core comprises a plurality of conductive wires.

7. The leakage detection system of claim 6, wherein each conductive wire is a copper wire, an enameled copper wire, or a nickel-clad copper wire.

8. The leakage detection system of claim 6, wherein each conductive wire has a cross-section perpendicular to the lengthwise direction of said conductive wire, and the cross-section is in a circular shape.

9. The leakage detection system of claim 1, wherein the waterproof gasket comprises a sealing ridge protruding therefrom, and provided for abutting the inner wall of the lower housing.

10. The leakage detection system of claim 1, wherein the leakage detection circuit breaker assembly comprises a current breaker, a breaker support, a connecting element, a connection reset element and a press button reset element, and each pin has a fixed contact point; the press button reset element is sheathed on the outer periphery of the press button and provided for resetting the press button, and the connection reset element is provided for restoring the position of the connecting element; the current breaker is installed to the control circuit board and coupled to the control circuit board via signal, and the connecting element is movably installed to the breaker support, and an output terminal of the current breaker is installed to the connecting element for driving the movement of the connecting element;
    the breaker support comprises a control arm disposed on two sides of the breaker support separately, and the connecting element has a drive slot formed therein, and the bottom of the press button has a snap slot; when the press button is shut, the slot wall of the drive slot is snapped into the snap slot and the press button drives the connecting element to move, and the connecting element is provided for driving the breaker support to move, and the control arm of the breaker support is provided for driving the conductive output element to be in contact with the fixed contact point.

11. The leakage detection system of claim 10, wherein the breaker support has a through slot formed thereon, and the connecting element is movably installed to the through slot, and the connecting element is configured with a limit bump, and an end of the connection reset element is sheathed on the limit bump, and the other end of the connection reset element abuts against the breaker support.

* * * * *